(12) United States Patent
Lee et al.

(10) Patent No.: US 11,862,220 B2
(45) Date of Patent: Jan. 2, 2024

(54) MEMORY DEVICE

(71) Applicant: Samsung Electronics Co., Ltd., Suwon-si (KR)

(72) Inventors: Minjun Lee, Seoul (KR); Yongseok Kim, Suwon-si (KR); Hyuncheol Kim, Seoul (KR); Jongman Park, Hwaseong-si (KR); Dongsoo Woo, Seoul (KR); Kyunghwan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/836,228

(22) Filed: Jun. 9, 2022

(65) Prior Publication Data

US 2023/0112070 A1 Apr. 13, 2023

(30) Foreign Application Priority Data

Oct. 13, 2021 (KR) ........................ 10-2021-0135934

(51) Int. Cl.
  *G11C 11/22* (2006.01)
  *G11C 5/06* (2006.01)
(52) U.S. Cl.
  CPC ............ *G11C 11/2273* (2013.01); *G11C 5/06* (2013.01); *G11C 11/2255* (2013.01); *G11C 11/2257* (2013.01); *G11C 11/2275* (2013.01)
(58) Field of Classification Search
  CPC ... G11C 11/2273; G11C 5/06; G11C 11/2255; G11C 11/2257; G11C 11/2275
  See application file for complete search history.

(56) References Cited

U.S. PATENT DOCUMENTS

| 5,770,483 A | 6/1998 | Kadosh et al. |
| 5,844,832 A | 12/1998 | Kim |
| 5,940,705 A | 8/1999 | Lee et al. |
| 6,067,244 A | 5/2000 | Ma et al. |
| 6,235,573 B1 | 5/2001 | Lee et al. |

(Continued)

FOREIGN PATENT DOCUMENTS

| JP | 2009230834 A | 10/2009 |
| KR | 100219519 B1 | 9/1999 |

(Continued)

OTHER PUBLICATIONS

K. Ni et al., "Write Disturb in Ferroelectric FETs and Its Implication for 1T-FeFET and Memory Arrays," IEEE Electron Device Letters, Sep. 27, 2018, pp. 1656-1659, vol. 39, No. 11.

(Continued)

*Primary Examiner* — Han Yang
(74) *Attorney, Agent, or Firm* — Muir Patent Law, PLLC

(57) ABSTRACT

Provided is a memory device. The memory device may include a substrate, a ferroelectric field effect transistor disposed on the substrate, a first channel contacting a gate structure of the ferroelectric field effect transistor and extending in a vertical direction from the gate structure of the ferroelectric field effect transistor, a selection word line disposed at one side of the first channel, a first gate dielectric layer disposed between the first channel and the selection word line, and a cell word line disposed on top of the first channel.

20 Claims, 25 Drawing Sheets

(56) References Cited

U.S. PATENT DOCUMENTS

| | | | |
|---|---|---|---|
| 6,370,056 B1* | 4/2002 | Chen | G11C 11/22 |
| | | | 365/185.08 |
| 6,710,388 B2 | 3/2004 | Haneder et al. | |
| 6,744,087 B2 | 6/2004 | Misewich et al. | |
| 7,586,774 B2 | 9/2009 | Joo et al. | |
| 9,905,557 B2 | 2/2018 | Saito et al. | |
| 10,403,631 B1 | 9/2019 | Lu et al. | |
| 2019/0318775 A1* | 10/2019 | Rakshit | G11C 11/221 |
| 2020/0357453 A1* | 11/2020 | Slesazeck | G11C 11/2255 |
| 2021/0026601 A1 | 1/2021 | Kobayashi et al. | |
| 2021/0043636 A1 | 2/2021 | Tsukamoto | |
| 2021/0074725 A1 | 3/2021 | Lue | |
| 2021/0375344 A1* | 12/2021 | Young | G11C 11/2273 |

FOREIGN PATENT DOCUMENTS

| | | |
|---|---|---|
| KR | 100247934 B1 | 3/2000 |
| KR | 100290281 B1 | 5/2001 |
| TW | 202001662 B | 1/2023 |

OTHER PUBLICATIONS

First Office Action dated Aug. 30, 2023 for corresponding TW Patent Application No. 111137920.

* cited by examiner

MEMORY DEVICE

CROSS-REFERENCE TO RELATED APPLICATION

This application is based on and claims priority under 35 U.S.C. § 119 to Korean Patent Application No. 10-2021-0135934, filed on Oct. 13, 2021, in the Korean Intellectual Property Office, the disclosure of which is incorporated by reference herein in its entirety.

BACKGROUND

The inventive concept relates to a memory device, and more particularly, to a memory device including a ferroelectric field effect transistor (FeFET).

The FeFET may include a ferroelectric layer as a gate dielectric layer. The ferroelectric layer may be in one of two stable polarization states according to a voltage applied thereto. A threshold voltage of the FeFET may vary according to the polarization state of the ferroelectric layer. Therefore, binary states may be stored in the FeFET and may be read therefrom. Ferroelectric random access memory (FeRAM), in which each memory cell only includes one FeFET, has been developed. However, when a write operation is to be performed on a specific memory cell, the write operation also affects other memory cells (write disturb). In addition, when a read operation is performed on a specific memory cells, other memory cells affect the read operation (read disturb).

SUMMARY

The inventive concept provides a memory device in which write disturbs and read disturbs among memory cells are prevented.

According to an aspect of the inventive concept, there is provided a memory device including a substrate, a ferroelectric field effect transistor disposed on the substrate, a first channel contacting a gate structure of the ferroelectric field effect transistor extending in a vertical direction from the gate structure of the ferroelectric field effect transistor, a selection word line disposed at a side of the first channel, a first gate dielectric layer disposed between the first channel and the selection word line, and a cell word line disposed on top of the first channel.

According to another aspect of the inventive concept, there is provided a memory device including a first memory cell, a second memory cell, a third memory cell, and a fourth memory cell each including a ferroelectric field effect transistor and a field effect transistor, wherein the ferroelectric field effect includes a grounded first source/drain, a first gate structure, and a second source/drain and the field effect transistor includes a third source/drain connected to the first gate structure, a second gate structure, and a fourth source/drain, a first selection word line connected to the second gate structure of each of the first memory cell and the second memory cell, a second selection word line connected to the second gate structure of each of the third memory cell and the fourth memory cell, a first bit line connected to the second source/drain of each of the first memory cell and the third memory cell, a second bit line connected to the second source/drain of each of the second memory cell and the fourth memory cell, a first cell word line connected to the fourth source/drain of each of the first memory cell and the third memory cell, and a second cell word line connected to each of the fourth source/drain of each of the second memory cell and the fourth memory cell, wherein, in a write operation on the fourth memory cell, a switching voltage is applied to the second selection word line, a write voltage is applied to the second cell word line, and 0 V is applied to the second bit line, the first selection word line, the first word line, and the second bit line.

According to another aspect of the inventive concept, there is provided a memory device including a substrate, a gate structure including a first gate dielectric layer, a ferroelectric layer, and a gate layer stacked on the substrate, a first source/drain disposed at one side of the gate structure, a second source/drain disposed at another side of the gate structure, a ground line that is in contact with the first source/drain and extending in a first horizontal direction, a bit line that is in contact with the second source/drain and extending in the first horizontal direction, a first channel and a second channel each contacting the gate structure, and each extending in a vertical direction from the gate structure, a channel connection layer disposed on the gate layer, the channel connection layer connecting the first channel and the second channel, and contacting the gate structure, a selection word line disposed between the first channel and the second channel and extending in a second horizontal direction, a second gate dielectric layer extending between the first channel and the selection word line, between the second channel and the selection word line, and between the channel connection layer and the selection word line, a cell word line disposed on top of the first channel and top of the second channel, and a third gate dielectric layer disposed between the cell word line and the selection word line.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
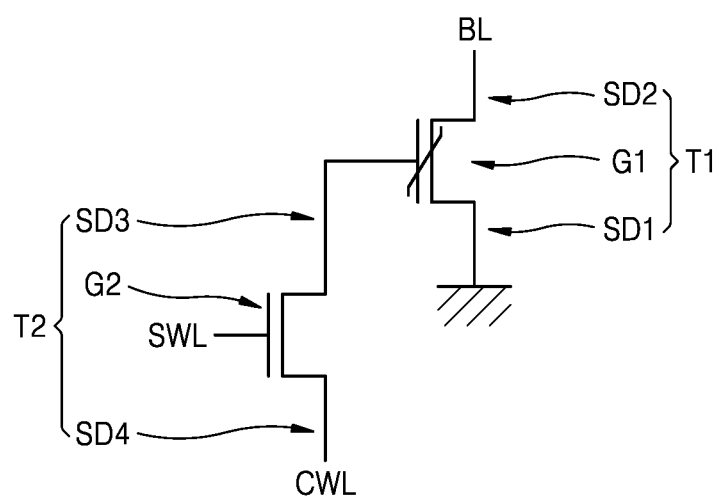
FIG. 1 is a circuit diagram of a memory cell of a memory device according to an example embodiment of the inventive concept.

FIG. 1 is a circuit diagram of a memory cell CM of a memory device according to an example embodiment of the inventive concept.

Referring to FIG. 1, the memory cell MC may include a ferroelectric field effect transistor (FeFET) T1 and a field effect transistor (FET) 12. The FeFET T1 may include a first gate structure G1, a first source/drain SD1, and a second source/drain SD2. The first source/drain SD1 may be grounded, and the second source/drain SD2 may be electrically connected to a bit line BL. The first gate structure G1 may be electrically connected to a third source/drain SD3 of the FET T2. The FET T2 may include a second gate structure G2, the third source/drain SD3, and a fourth source/drain SD4. The third source/drain SD3 of the FET T2 may be electrically connected to the first gate structure G1 of the FeFET T1. The fourth source/drain SD4 may be electrically connected to a cell word line CWL. The second gate structure G2 may be electrically connected to a selection word line SWL.

Figure 2:
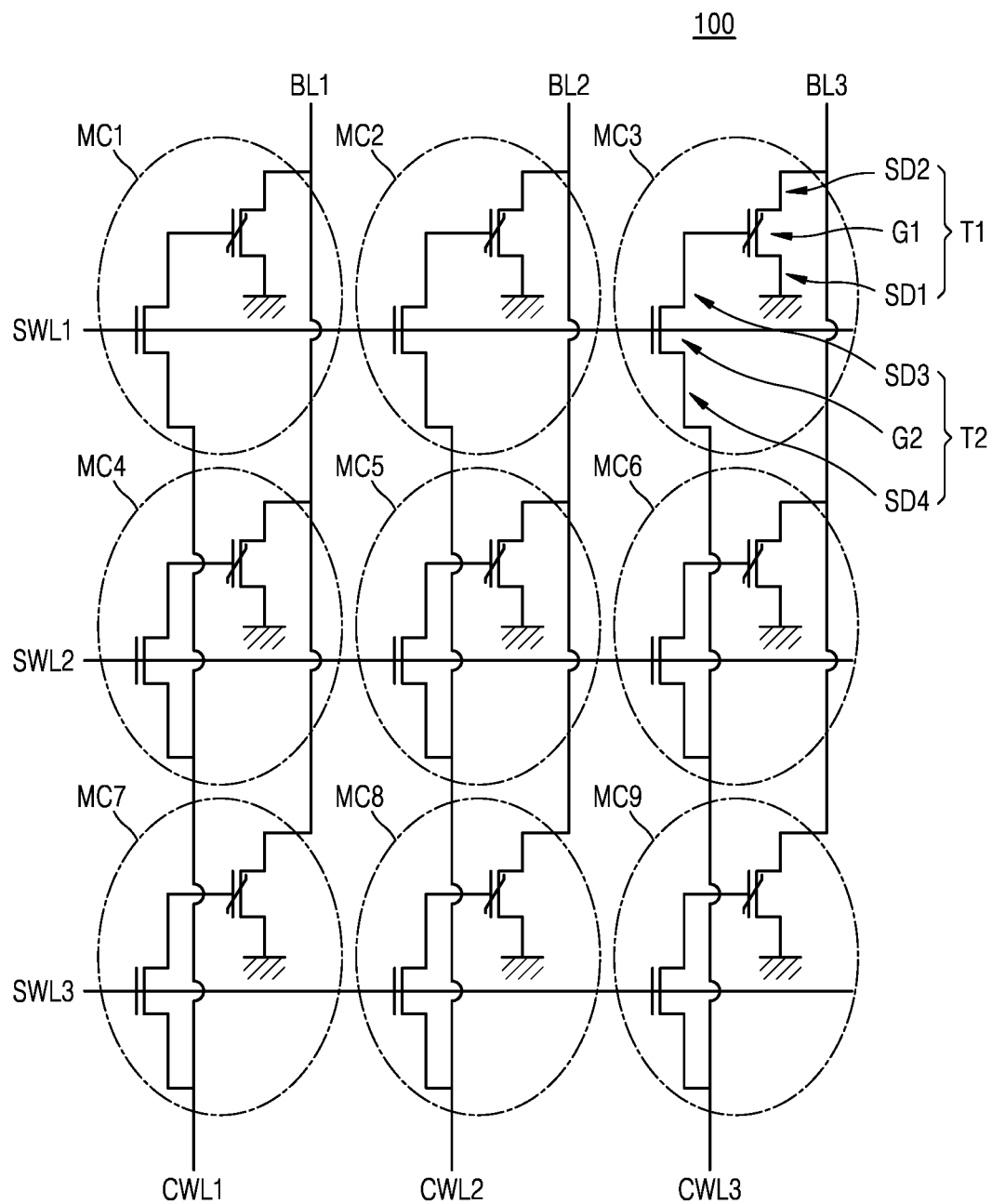
FIG. 2 is a circuit diagram of a memory device according to an example embodiment of the inventive concept.

FIG. 2 is a circuit diagram of a memory device 100 according to an example embodiment of the inventive concept.

Referring to FIG. 2, the memory device 100 may include: a first memory cell MC1, a second memory cell MC2, a third memory cell MC3, a fourth memory cell MC4, a fifth memory cell MC5, a sixth memory cell MC6, a seventh memory cell MC7, an eighth memory cell MC8, and a ninth memory cell MC9; a first bit line BL1, a second bit line BL2, and a third bit line BL3; a first cell word line CWL1, a second cell word line CWL2, and a third cell word line CWL3; and a first selection word line SWL1, a second selection word line SWL2, and a third selection word line SWL3. Although FIG. 2 illustrates nine memory cells, three bit lines, three cell word lines, and three selection word lines, the numbers of memory cells, bit lines, cell word lines, and selection word lines included in the memory device 100 are not limited thereto and may be variously modified.

The second source/drain SD2 of the FeFET T1 of each of the first memory cell MC1, the fourth memory cell MC4, and the seventh memory cell MC7 may be electrically connected to the first bit line BL1. The fourth source/drain SD4 of the FET T2 of each of the first memory cell MC1, the fourth memory cell MC4, and the seventh memory cell MC7 may be electrically connected to the first cell word line CWL1.

The second source/drain SD2 of the FeFET T1 of each of the second memory cell MC2, the fifth memory cell MC5, and the eighth memory cell MC8 may be electrically connected to the second bit line BL2. The fourth source/drain SD4 of the FET T2 of each of the second memory cell MC2, the fifth memory cell MC5, and the eighth memory cell MC8 may be electrically connected to the second cell word line CWL2.

The second source/drain SD2 of the FeFET T1 of each of the third memory cell MC3, the sixth memory cell MC6, and the ninth memory cell MC9 may be electrically connected to the third bit line BL3. The fourth source/drain SD4 of the FET T2 of each of the third memory cell MC3, the sixth memory cell MC6, and the ninth memory cell MC9 may be electrically connected to the third cell word line CWL3.

The second gate structure G2 of the FET T2 of each of the first memory cell MC1, the second memory cell MC2, and the third memory cell MC3 may be electrically connected to the first selection word line SWL1. The second gate structure G2 of the FET T2 of each of the fourth memory cell MC4, the fifth memory cell MC5, and the sixth memory cell MC6 may be electrically connected to the second selection word line SWL2. The second gate structure G2 of the FET T2 of each of the seventh memory cell MC7, the eighth memory cell MC8, and the ninth memory cell MC9 may be electrically connected to the third selection word line SWL3.

Figure 3:
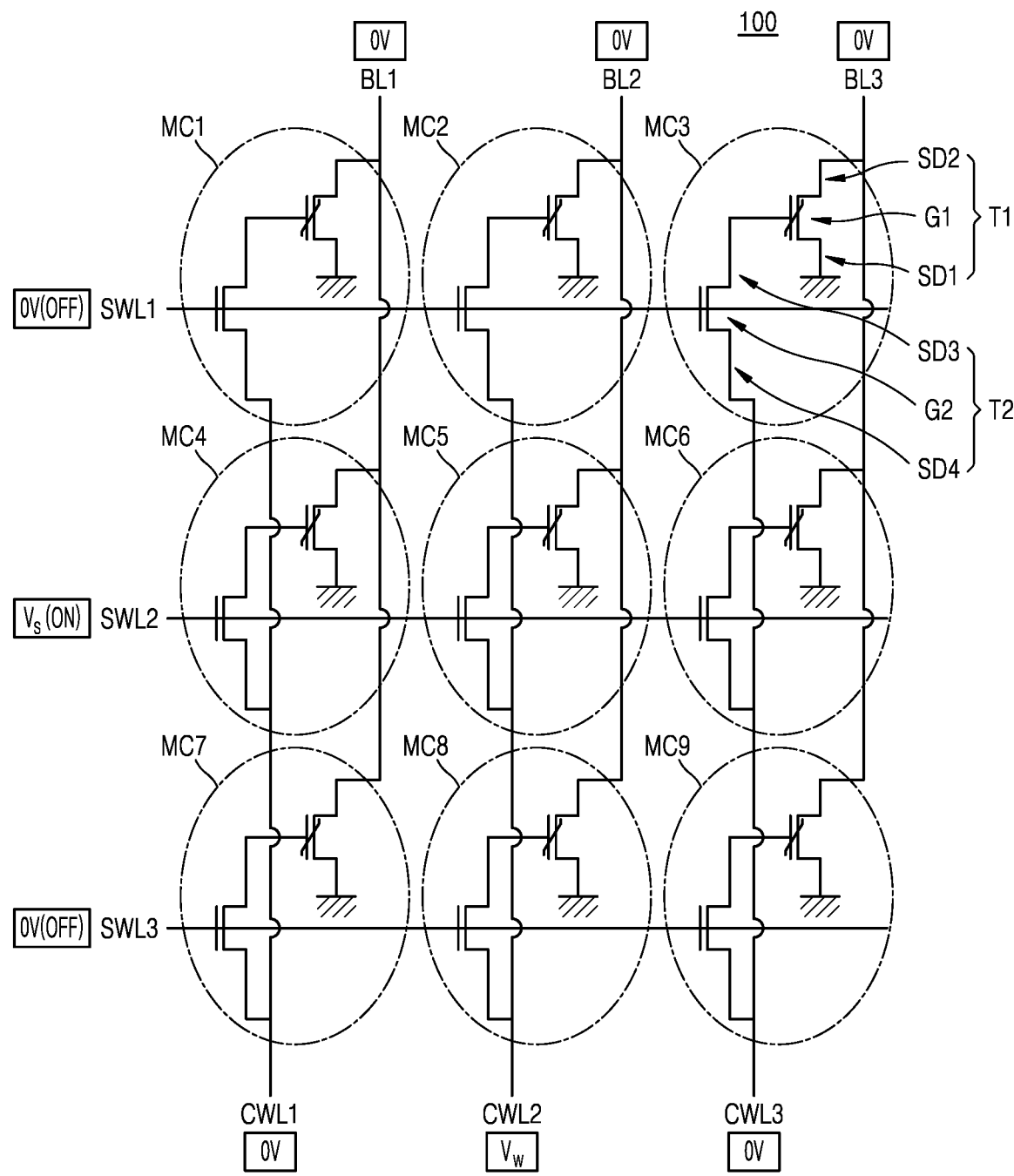
FIG. 3 is a circuit diagram of a memory device according to an example embodiment of the inventive concept during a write operation.

FIG. 3 is a circuit diagram of the memory device according to an example embodiment of the inventive concept during a write operation.

Referring to FIG. 3, to perform a write operation on the fifth memory cell MC5, a switching voltage Vs may be applied to the second selection word line SWL2. On the contrary, 0 V may be applied to the first selection word line SWL1 and the third selection word line SWL3. Therefore, the FET T2 of each of the fourth memory cell MC4, the fifth memory cell MC5, and the sixth memory cell MC6 may be turned on, and the first memory cell MC1, the second memory cell MC2, the third memory cell MC3, the seventh memory cell MC7, the eighth memory cell MC8, and the ninth memory cell MC9 may be turned off. Accordingly, the first gate structure G1 of the FeFET T1 of each of the first memory cell MC1, the second memory cell MC2, the third memory cell MC3, the seventh memory cell MC7, the eighth memory cell MC8, and the ninth memory cell MC9 may be in a floating state. Therefore, a polarization state of the first memory cell MC1, the second memory cell MC2, the third memory cell MC3, the seventh memory cell MC7, the eighth memory cell MC8, and the ninth memory cell MC9 may be not changed.

In addition, a write voltage VW may be applied to the second cell word line CWL2. On the contrary, 0 V may be applied to the first cell word line CWL1 and the third cell word line CWL3. In addition, 0 V may be applied to the first bit line BL1, the second bit line BL2, and the third bit line BL3.

When the FET T2 of each of the fourth memory cell MC4 and the sixth memory cell MC6 is turned on, 0 V may be applied to the first gate structure G1 of the FeFET T1. As 0 V is applied to the first source/drain SD1, the first gate structure G1, and the second source/drain SD2 of the FeFET T1 of each of the fourth memory cell MC4 and the sixth memory cell MC6, the polarization state of the fourth memory cell MC4 and the sixth memory cell MC6 may be not changed.

When the fifth memory cell MC5 is turned on, the write voltage VW may be applied to the first gate structure G1 of the FeFET T1. As 0 V is applied to the first source/drain SD1 and second source/drain SD2 of the FeFET T1 and the write voltage VW is applied to the first gate structure G1 of the FeFET T1, the polarization state of the fifth memory cell MC5 may be changed. Accordingly, the write operation may be performed only on the fifth memory cell MC5, and may not affect the first memory cell MC1, the second memory cell MC2, the third memory cell MC3, the fourth memory cell MC4, the sixth memory cell MC6, the seventh memory cell MC7, the eighth memory cell MC8, and the ninth memory cell MC9. That is, write disturbs among the memory cells may be prevented.

Figure 4:
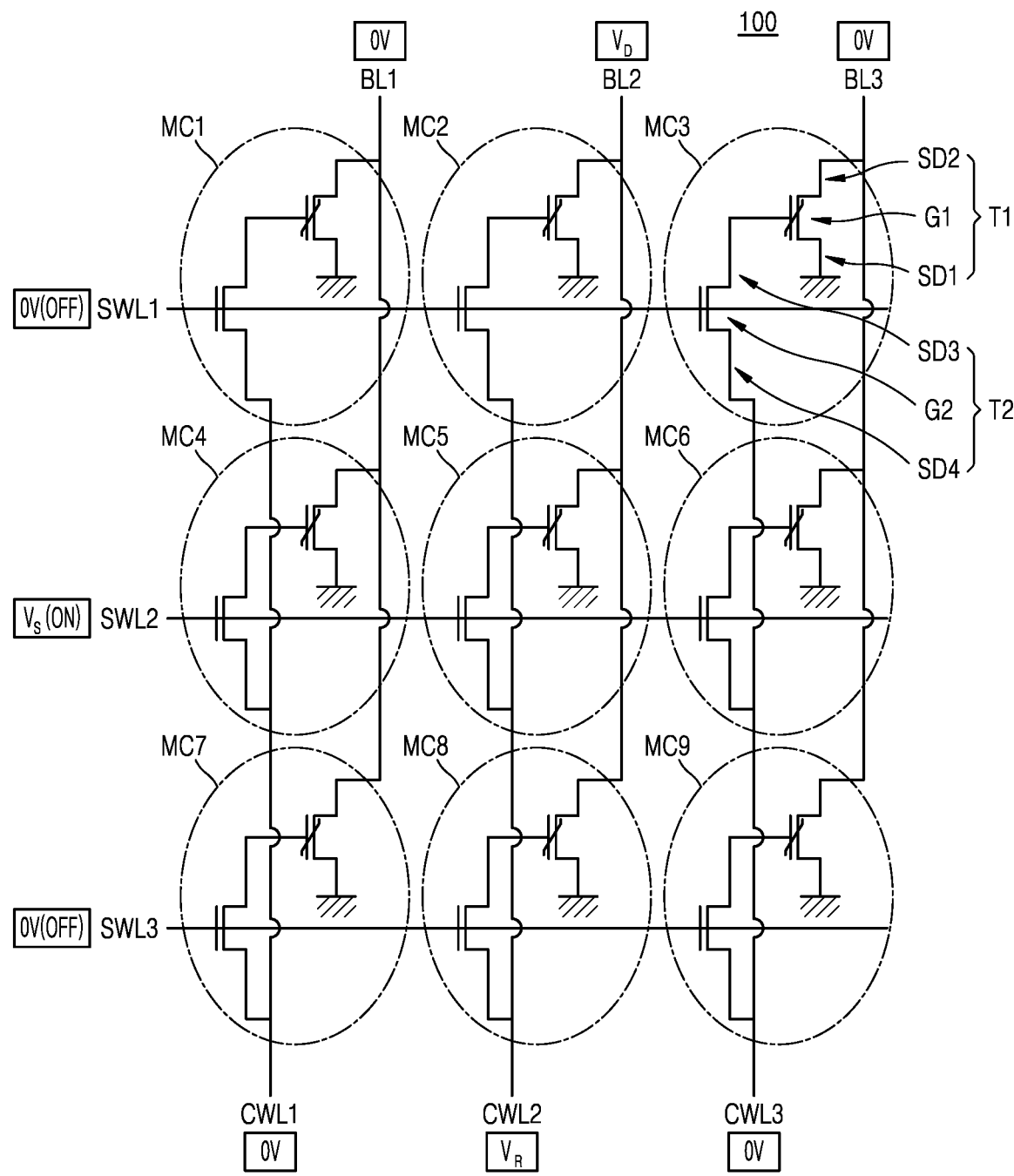
FIG. 4 is a circuit diagram of a memory device according to an example embodiment of the inventive concept during a read operation.

FIG. 4 is a circuit diagram of the memory device 100 according to an example embodiment of the inventive concept during a read operation.

Referring to FIG. 4, to perform the read operation on the fifth memory cell MC5, the switching voltage Vs may be applied to the second selection word line SWL2. On the contrary, 0 V may be applied to the first selection word line SWL1 and the third selection word line SWL3. Therefore, the FET T2 of each of the fourth memory cell MC4, the fifth memory cell MC5, and the sixth memory cell MC6 may be turned on, and the first memory cell MC1, the second memory cell MC2, the third memory cell MC3, the seventh memory cell MC7, the eighth memory cell MC8, and the ninth memory cell MC9 may be turned off. Accordingly, the first gate structure G1 of the FeFET T1 of each of the first memory cell MC1, the second memory cell MC2, the third memory cell MC3, the seventh memory cell MC7, the eighth memory cell MC8, and the ninth memory cell MC9 may be in a floating state. Accordingly, a current may not flow between the second source/drain SD2 and the first source/drain SD1 of each of the first memory cell MC1, the second memory cell MC2, the third memory cell MC3, the seventh memory cell MC7, the eighth memory cell MC8, and the ninth memory cell MC9.

In addition, a read voltage $V_R$ may be applied to the second cell word line CWL2. On the contrary, 0 V may be applied to the first cell word line CWL1 and the third cell word line CWL3. In addition, a drain voltage $V_D$ may be applied to the second bit line BL2. On the contrary, 0 V may be applied to the first bit line BL1 and the third bit line BL3.

When the FET T2 of each of the fourth memory cell MC4 and the sixth memory cell MC6 is turned on, 0 V may be applied to the first gate structure G1 of the FeFET T1. As 0 V is applied to the first source/drain SD1, the first gate structure G1, and the second source/drain SD2 of the FeFET T1 of each of the fourth memory cell MC4 and the sixth memory cell MC6, a current may not flow between the second source/drain SD2 and the first source/drain SD1 of the FeFET T1 of each of the fourth memory cell MC4 and the sixth memory cell MC6.

When the fifth memory cell MC5 is turned on, the read voltage $V_R$ may be applied to the first gate structure G1 of the FeFET T1. As 0 V and the drain voltage $V_D$ are respectively applied to the first source/drain SD1 and the second source/drain SD2 of the FeFET T1 and the read voltage $V_R$ is applied to the first gate structure G1 of the FeFET T1, a current may flow between the second source/drain SD2 and the first source/drain SD1 of the FeFET T1 of the fifth memory cell MC5. Accordingly, the read operation may be performed only on the fifth memory cell MC5, and the first memory cell MC1, the second memory cell MC2, the third memory cell MC3, the fourth memory cell MC4, the sixth memory cell MC6, the seventh memory cell MC7, the eighth memory cell MC8, and the ninth memory cell MC9 may not affect the read operation. That is, read disturbs among the memory cells may be prevented.

Figure 5A:
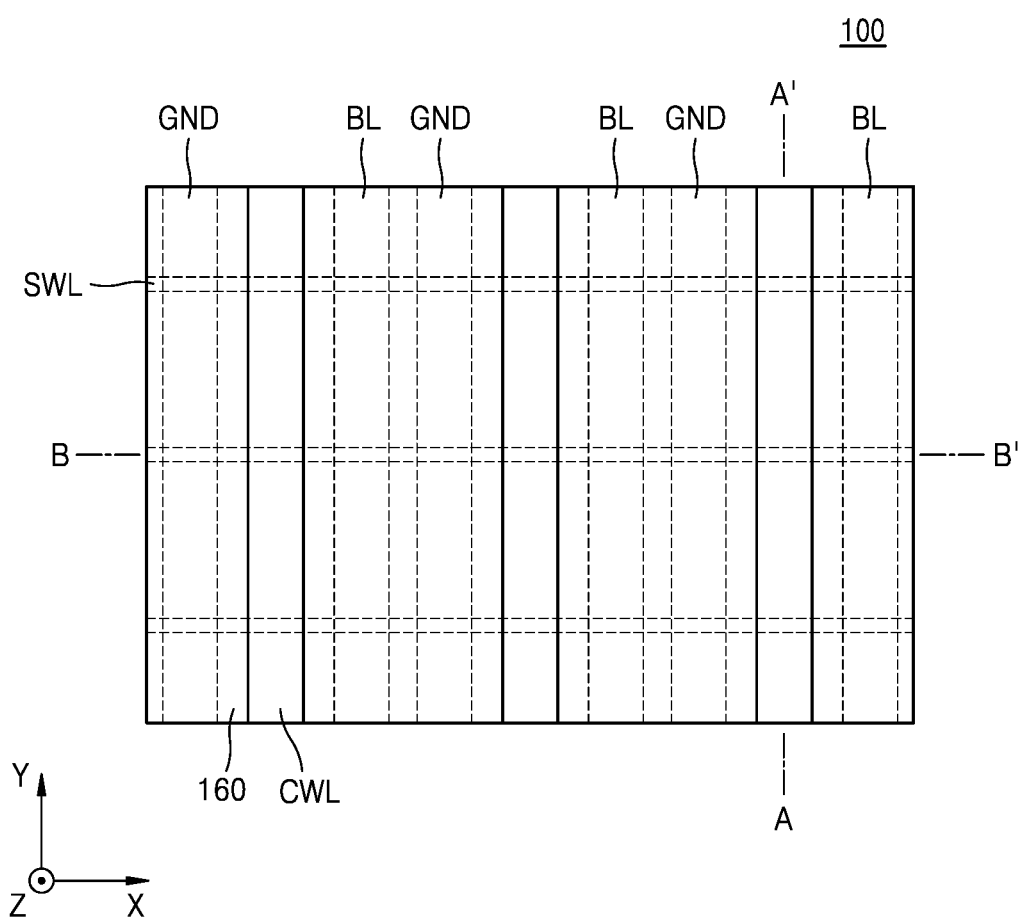
FIG. 5A is a top-plan view of a memory device according to an example embodiment of the inventive concept.
Figure 5B:
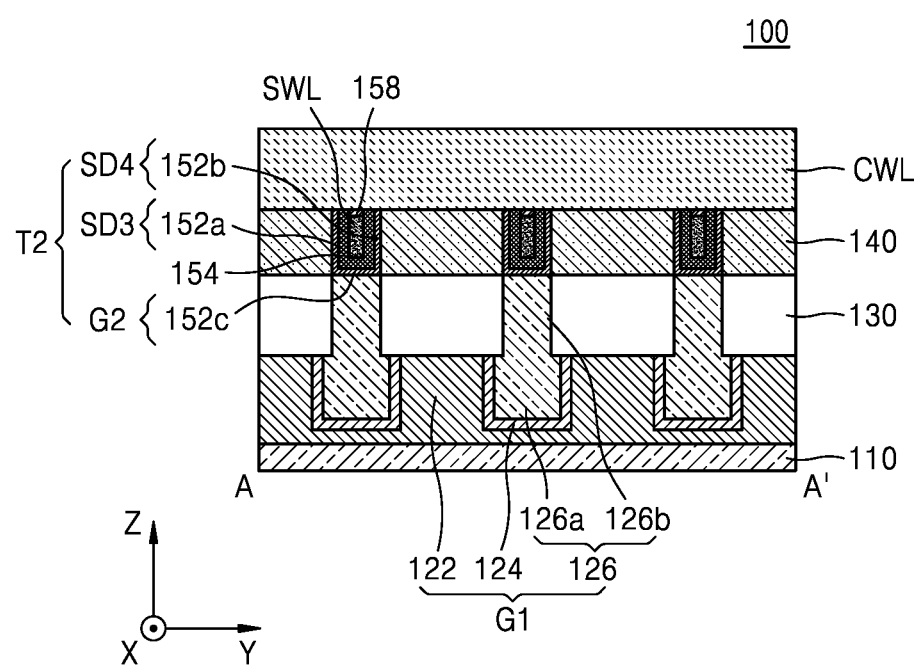
FIG. 5B is a cross-sectional view of a memory device according to an example embodiment of the inventive concept, taken along line A-A' shown in FIG. 5A.
Figure 5C:
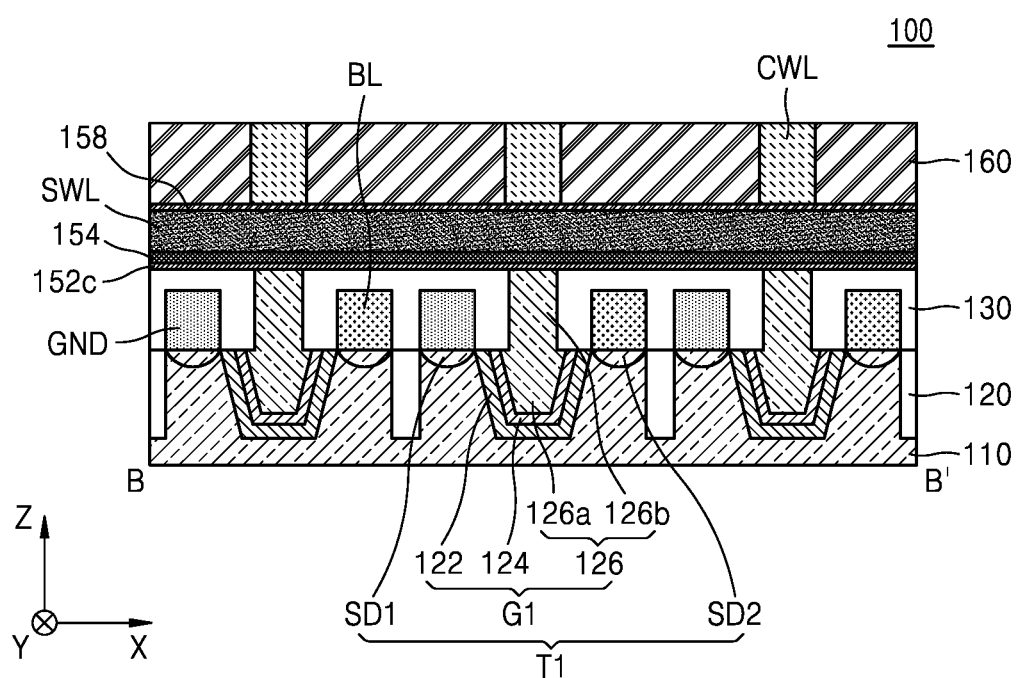
FIG. 5C is a cross-sectional view of a memory device according to an example embodiment of the inventive concept, taken along line B-B' shown in FIG. 5A.

FIG. 5A is a top-plan view of the memory device 100 according to an example embodiment of the inventive concept. FIG. 5B is a cross-sectional view of the memory device 100 according to an example embodiment of the inventive concept, taken along line A-A' shown in FIG. 5A. FIG. 5C is a cross-sectional view of the memory device 100 according to an example embodiment of the inventive concept, taken along line B-B' shown in FIG. 5B.

Referring to FIGS. 5A to 5C, the memory device 100 according to an example embodiment or may be formed of may include a substrate 110. The substrate 110 may include a semiconductor material such as a Group IV semiconductor material, a Group III-V semiconductor material, or a Group II-VI semiconductor material. The Group IV semiconductor material may include or may be formed of, for example, silicon (Si), germanium (Ge), or Si—Ge. The Group III-V semiconductor material may include or may be formed of, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include or may be formed of, for example, zinc telluride (ZnTe) or cadmium sulfide (CdS).

The memory device 100 may further include the FeFET T1 on the substrate 110. The FeFET T1 may include the first gate structure G1 on the substrate 110, the first source/drain SD1 at one side of the first gate structure G1, and the second source/drain SD2 at another side of the first gate structure G1.

In some embodiments, as shown in FIG. 5C, a bottom portion of the first gate structure G1 may be recessed into the substrate 110. In other words, the FeFET T1 may be a recessed transistor. When the bottom portion of the first gate structure G1 is recessed into the substrate 110, an area of a ferroelectric layer 124 may increase. Accordingly, a polarization distribution of the ferroelectric layer 124 may decrease. Therefore, a distribution of threshold voltages of the FeFET T1 may decrease. Thus, a distribution of operation characteristics of the memory device 100 may decrease. In another embodiment, unlike shown in FIG. 5C, the first gate structure G1 may be on a plane surface of the substrate 110. That is, the FeFET T1 may include a planar transistor. In another embodiment, unlike shown in FIG. 5C, the first gate structure G1 may be on a protruding fin structure on the substrate 110. That is, the FeFET T1 may include a fin-type transistor.

The first gate structure G1 may include the ferroelectric layer 124 and a gate layer 126 stacked on the substrate 110. The ferroelectric layer 124 may include a ferroelectric material. The ferroelectric material may include or may be formed of, for example, hafnium oxide ($HfO_2$), doped $HfO_2$, for example, Si-doped $HfO_2$ or Al-doped $HfO_2$, zirconium dioxide ($ZrO_2$), doped $ZrO_2$, for example, lithium (Li)-doped $ZrO_2$ or Mg-doped $ZrO_2$), $Hf_xZr_{1-x}O_2$ (0<x<1), or $ATiO_3$ (where A includes barium (Ba), strontium (Sr), calcium (Ca), or lead (Pb)).

The gate layer 126 may include or be formed of polysilicon, a metal, or a metal nitride. The gate layer 126 may include or may be, for example, tungsten (W). In some embodiments, the gate layer 126 may include a bottom portion 126a on the ferroelectric layer 124 and a top portion 126b on the bottom portion 126a. In some embodiments, the bottom portion 126a of the gate layer 126 may be recessed into the substrate 110, and the top portion 126b of the gate layer 126 may be not recessed into the substrate 110.

The first gate structure G1 may further include a first gate dielectric layer 122 between the ferroelectric layer 124 and the substrate 110. The first gate dielectric layer 122 may include or may be formed of silicon oxide (Sift), silicon nitride (SiN), or a high-k material. The high-k material may include or may be formed of, for example, aluminum oxide ($Al_2O_3$), $HfO_2$, yttrium oxide ($Y_2O_3$), zirconium dioxide ($ZrO_2$), titanium oxide ($TiO_2$), or a combination thereof. In some embodiments, the first gate dielectric layer 122 may extend in a second horizontal direction (the Y direction). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," etc.).

As shown in FIG. 5C, the first source/drain SD1 and the second source/drain SD2 may be in the substrate 110. The first source/drain SD1 and the second source/drain SD2 may include doped regions in the substrate 110. In another embodiment, unlike shown in FIG. 5C, the first source/drain SD1 and the second source/drain SD2 may be on the substrate 110. In this case, the first source/drain SD1 and the second source/drain SD2 may include doped epitaxial layers on the substrate 110. The first source/drain SD1 and the second source/drain may include a doped semiconductor material.

The memory device 100 may further include a device isolation layer 120. The device isolation layer 120 may electrically isolate two FeFETs T1 from each other. The two FeFETs T1 extend in the second horizontal direction (the Y direction) and are adjacent to each other in a first horizontal direction (the X direction). The device isolation layer 120 may include or may be silicon oxide, silicon nitride, a low-k material, or a combination thereof. The low-k material may include or may be formed of, for example, fluorinated tetraethylorthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), Tonen SilaZene (TOSZ), fluoride silicate glass (FSG), polypropylene oxide, carbon doped silicon oxide (CDO), organo silicate glass (OSG), SiLK, amorphous fluorinated carbon, silica aerogel, silica xerogel, mesoporous silica, or a combination thereof.

The memory device 100 may further include a ground line GND that is in contact with the first source/drain SD1. The ground line GND may extend in the second horizontal direction (the Y direction). The ground line GND may include a metal or a metal nitride. For example, the ground line GND may include or may be formed of tungsten (W), aluminum (Al), copper (Cu), gold (Au), silver (Ag), titanium (Ti), titanium nitride (TiN), tantalum nitride (TaN), or a combination thereof.

The memory device 100 may further include a bit line BL that is in contact with the second source/drain SD2. The bit line BL may extend in the second horizontal direction (the Y direction). In some embodiments, the ground line GND and the bit line BL may extend in parallel to each other. The bit line BL may include or may be formed of a metal or a metal nitride. For example, the bit line BL may include or may be formed of W, Al, Cu, Au, Ag, Ti, TiN, TaN, or a combination thereof.

The memory device 100 may further include a first interlayer insulating layer 130 covering the ground line GND and the bit line BL and surrounding the top portion 126b of the gate layer 126. The first interlayer insulating layer 130 may extend between the ground line GND and the top portion 126b of the gate layer 126, between the ground line GND and a channel connection layer 152c, between the bit line BL and the top portion 126b of the gate layer 126, and between the bit line BL and the channel connection layer 152c. The first interlayer insulating layer 130 may also extend between the ground line GND and the selection word line SWL, and between the bit line BL and the selection word line SWL. The first interlayer insulating layer 130 may include or may be formed of silicon oxide, silicon nitride, a low-k material, or a combination thereof. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), Tonen SilaZene (TOSZ), Fluoride Silicate Glass (FSG), polypropylene oxide, carbon doped silicon oxide (CDO), organo silicate glass (OSG), SiLK, amorphous fluorinated carbon, silica aerogel, silica xerogel, mesoporous silica, or a combination thereof.

As shown in FIG. 5B, the memory device 100 may further include a first channel 152a extending in the vertical direction (the Z direction) from the first gate structure G1. The first channel 152a may extend in the vertical direction (the Z direction) from the top portion 126b of the gate layer 126 to the cell word line CWL. The first channel 152a may include or may be formed of a semiconductor material, for example, Si, Ge, and the like. In another embodiment, the first channel 152a may include a transition metal dichalcogenide (TMD). For example, the first channel 152a may include or may be formed of $MX_2$, where M may include molybdenum (Mo), tungsten (W), or copper (Cu). X may include sulfur (S), selenium (Se), or tellurium (Te). In another embodiment, the first channel 152a may include an oxide semiconductor material. For example, the first channel 152a may include or may be formed of indium zinc oxide (IZO), zinc tin oxide (ZTO), yttrium zinc oxide (YZO), indium gallium zinc oxide (IGZO), or the like.

In some embodiments, as shown in FIG. 5B, the memory device 100 may further include a second channel 152b extending in the vertical direction (the Z direction) from the first gate structure G1. The second channel 152b may extend in the vertical direction (the Z direction) from the top portion 126b of the gate layer 126 to the cell word line CWL. The second channel 152b may extend in parallel to the first channel 152a. In some embodiments, the second channel 152b may include a material that is the same as the first channel 152a. The second channel 152b may include or may be formed of a semiconductor material, for example, Si, Ge, and the like. In another embodiment, the second channel 152b may include a TMD. For example, the second channel 152b may include or may be formed of $MX_2$, where M may include Mo, W, or Cu. X may include S, Se, or Te. In another embodiment, the second channel 152b may include an oxide semiconductor material. For example, the second channel 152b may include or may be formed of IZO, ZTO, YZO, IGZO, or the like.

In some embodiments, the memory device 100 may further include a channel connection layer 152c connecting the first channel 152a to the second channel 152b and on the top portion 126b of the gate layer 126 of the first gate structure G1. As shown in FIG. 5C, the channel connection layer 152c may extend in a first horizontal direction (the X direction). In some embodiments, as shown in FIG. 5C, the channel connection layer 152c extending in the first horizontal direction (the X direction) may contact the top portions 126b of the gate layers 126 of the plurality of first gate structures G1. However, in other embodiments, unlike shown in FIG. 5C, the channel connection layer 152c may be cut such that one channel connection layer 152c may contact the top portion 126b of the gate layer 126 of only one of the first gate structures G1.

In some embodiments, the channel connection structure 152c may include materials that are the same as materials of the first channel 152a and the second channel 152b. The channel connection layer 152c may include or may be formed of a semiconductor material, for example, Si, Ge, and the like. In other embodiments, the channel connection layer 152c may include a TMD. For example, the channel connection layer 152c may include $MX_2$, where M may include Mo, W, or Cu. X may include S, Se, or Te. In another embodiment, the channel connection layer 152c may include an oxide semiconductor material. For example, the channel connection layer 152c may include or may be formed of IZO, ZTO, YZO, IGZO, or the like.

The memory device 100 may further include the selection word line SWL at a side of the first channel 152a. The selection word line SWL may extend in the first horizontal direction (the X direction). The ground line GND and the bit line BL may extend in the second horizontal direction (the Y direction). The first horizontal direction (the X direction) may be not parallel to the second horizontal direction (the Y direction). Although FIGS. 5A to 5C illustrate that the first horizontal direction (the X direction) is perpendicular to the second horizontal direction (the Y direction), in another embodiment, unlike in FIG. 5C, the first horizontal direction (the X direction) may be not perpendicular to the second direction (the Y direction). In some embodiments, the selection word line SWL may pass between the first channel 152a and the second channel 152b. The selection word line SWL may include a metal or a metal nitride. For example, the selection word line SWL may include or may be formed of W, Al, Cu, Au, Ag, Ti, TiN, TaN, or a combination thereof.

The memory device 100 may further include a second gate dielectric layer 154 between the first channel 152a and the selection word line SWL. In some embodiments, the second gate dielectric layer 154 may further extend between the second channel 152b and the selection word line SWL. In some embodiments, the second gate dielectric layer 154 may further extend between the channel connection layer 152c and the selection word line SWL. In other words, the second gate dielectric layer 154 may contact two side surfaces and a bottom surface of the selection word line SWL. The second gate dielectric layer 154 may include: a portion on the first channel 152a, extending in the vertical direction (the Z direction) from the channel connection layer 152c to the cell word line CWL; a portion on the second channel 152b, extending in the vertical direction (the Z direction) from the channel connection layer 152c to the cell word line CWL; and a portion on the channel connection layer 152c, extending in the second horizontal direction (the Y direction) from the first channel 152a to the second channel 152b. The portion of the second gate dielectric layer 154 that is in contact with the channel connection layer 152c may extend in the first horizontal direction (the X direction). The second gate dielectric layer 154 may include Sift, SiN, or a high-k material. The high-k material may include, for example, aluminum oxide ($Al_2O_3$), $HfO_2$, yttrium oxide ($Y_2O_3$), zirconium dioxide ($ZrO_2$), titanium oxide ($TiO_2$), or a combination thereof. The memory device 100 may further include the FET T2, which is vertically arranged (in the Z direction) on the FeFET T1. The FET T2 may include the first channel 152a, the second channel 152b, the channel connection layer 152c, and the second gate dielectric layer 154. The channel connection layer 152c may form the second gate structure G2 of the FET T2. The channel connection layer 152c (i.e., the second gate structure G2) is electrically connected to the first gate structure G1 of the FeFET T1.

The first channel 152a and the second channel 152b may include a drain region and a source region. Accordingly, the first channel 152a and the second channel 152b correspond to the third source/drain SD3 and the fourth source/drain SD4 of the FET T2. The third source/drain SD3 of the FET T2 may be electrically connected to the first gate structure G1 of the FeFET T1. The fourth source/drain SD4 may be electrically connected to a cell word line CWL. The second gate structure G2 may be electrically connected to the selection word line SWL.

The memory device 100 may further include a second interlayer insulating layer 140 on the first interlayer insulating layer 130. The second interlayer insulating layer 140 may contact the first channel 152a and the second channel 152b. The second interlayer insulating layer 140 may include or may be formed of silicon oxide, silicon nitride, a low-k material, or a combination thereof. The low-k material may include, for example, fluorinated tetraethyl orthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), Tonen SilaZene (TOSZ), fluoride silicate glass (FSG), polypropylene oxide, carbon doped silicon oxide (CDO), organo silicate glass (OSG), SiLK, amorphous fluorinated carbon, silica aerogel, silica xerogel, mesoporous silica, or a combination thereof.

The memory device 100 may further include a third gate dielectric layer 158 on a top surface of the selection word line SWL. The third gate dielectric layer 158 may be between the selection word line SWL and the cell word line CWL. The third gate dielectric layer 158 may extend in the first horizontal direction (the X direction). The third gate dielectric layer 158 may include a material that is the same as or different from the material of the second gate dielectric layer 154. The third gate dielectric layer 158 may include or may be formed of silicon oxide, silicon nitride, a low-k material, or a combination thereof. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), Tonen SilaZene (TOSZ), fluoride silicate glass (FSG), polypropylene oxide, carbon doped silicon oxide (CDO), organo silicate glass (OSG), SiLK, amorphous fluorinated carbon, silica aerogel, silica xerogel, mesoporous silica, or a combination thereof. The high-k material may include, for example, aluminum oxide ($Al_2O_3$), $HfO_2$, yttrium oxide ($Y_2O_3$), zirconium dioxide ($ZrO_2$), titanium oxide ($TiO_2$), or a combination thereof.

The memory device 100 may further include the cell word line CWL on the top of the first channel 152a. The cell word line CWL may be on the top of the second channel 152b. The cell word line CWL may be on the top of the second gate dielectric layer 154. The cell word line CWL may be on the top of the third gate dielectric layer 158. The cell word line CWL may extend in the second horizontal direction (the Y direction). The cell word line CWL may extend in parallel to the ground line GND and the bit line BL. The cell word line CWL may include or may be formed of a metal or a metal nitride. For example, the cell word line CWL may include W, Al, Cu, Au, Ag, Ti, TiN, TaN, or a combination thereof.

The memory device 100 may further include a third interlayer insulating layer 160 filling a gap between the cell word lines CWL adjacent to each other. The third interlayer insulating layer 160 may be on the third gate dielectric layer 158. The third interlayer insulating layer 160 may include or may be formed of silicon oxide, silicon nitride, or a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethysilyl phosphate (TMSP), polytetrafluoroethylene (PTFE), Tonen SilaZene (TOSZ), fluoride silicate glass (FSG), polypropylene oxide, carbon doped silicon oxide (CDO), organo silicate glass (OSG), SiLK, amorphous fluorinated carbon, silica aerogel, silica xerogel, mesoporous silica, or a combination thereof.

FIGS. 6A, 7A, 8A, 9A, 10A, and 11A are top-plan views illustrating a method of manufacturing a memory device, according to an embodiment of the inventive concept. FIGS. 6B, 7B, 8B, 9B, 10B, and 11B are cross-sectional views illustrating a method of manufacturing a memory device, taken along line A-A' shown in FIGS. 6A, 7A, 8A, 9A, 10A, and 11A. FIGS. 6C, 7C, 8C, 9C, 10C, and 11C are cross-sectional views illustrating a method of manufacturing a memory device, taken along line B-B' shown in FIGS. 6A, 7A, 8A, 9A, 10A, and 11A.

Figure 6A:
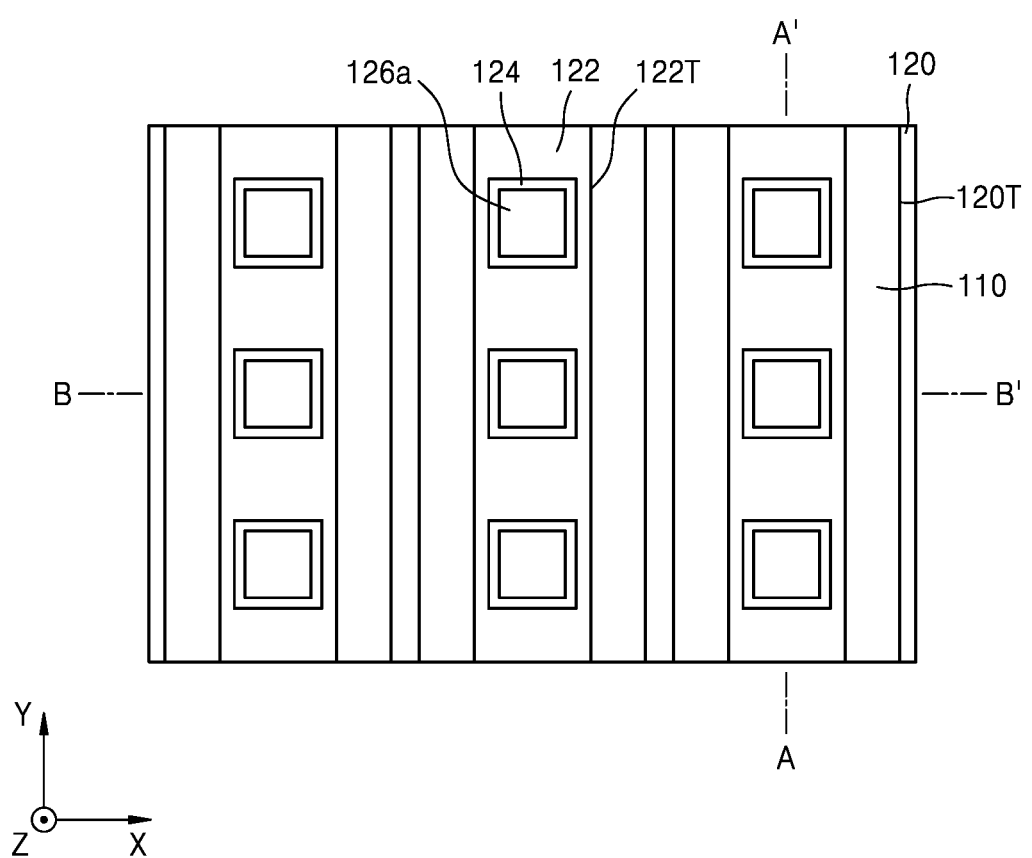
FIGS. 6A, 7A, 8A, 9A, 10A, and 11A are top-plan views illustrating a method of manufacturing a memory device, according to an example embodiment of the inventive concept.
Figure 6B:
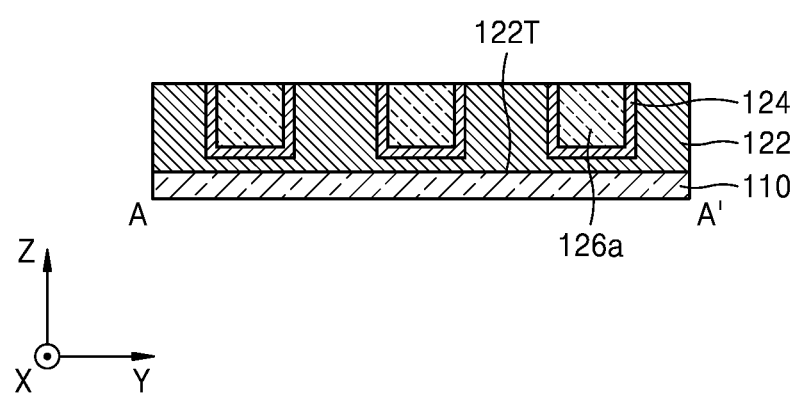
FIGS. 6B, 7B, 8B, 9B, 10B, and 11B are cross-sectional views illustrating a method of manufacturing a memory device, taken along line A-A' shown in FIGS. 6A, 7A, 8A, 9A, 10A, and 11A.
Figure 6C:
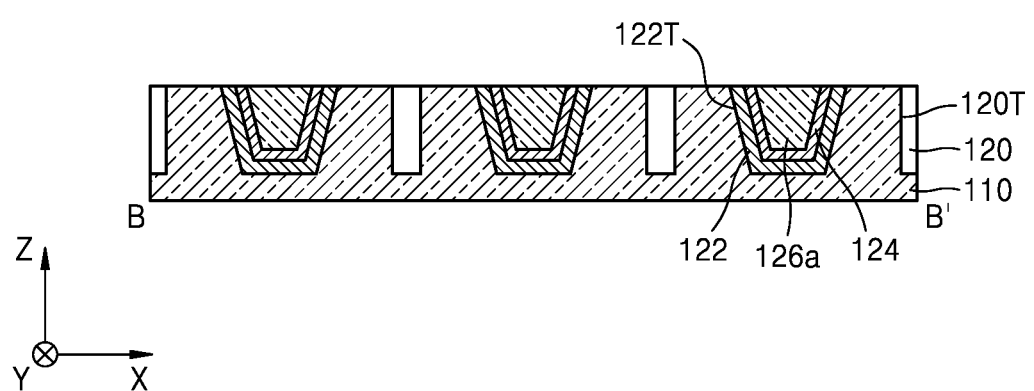
FIGS. 6C, 7C, 8C, 9C, 10C, and 11C are cross-sectional views illustrating a method of manufacturing a memory device, taken along line B-B' shown in FIGS. 6A, 7A, 8A, 9A, 10A.

Referring to FIGS. 6A to 6C, a device isolation trench 120T extending in the second horizontal direction (the Y direction) may be formed in the substrate 110. A device isolation layer 120 may be formed in the device isolation trench 120T. In addition, a first line trench 122T extending in the second horizontal direction (the Y direction) may be formed in the substrate 110. The first gate dielectric layer 122 may be formed in the first line trench 122T. A portion of the first gate dielectric layer 122 may be etched, and the ferroelectric layer 124 and the bottom portion 126a of the gate layer 126 may be formed in the etched portion.

Figure 7A:
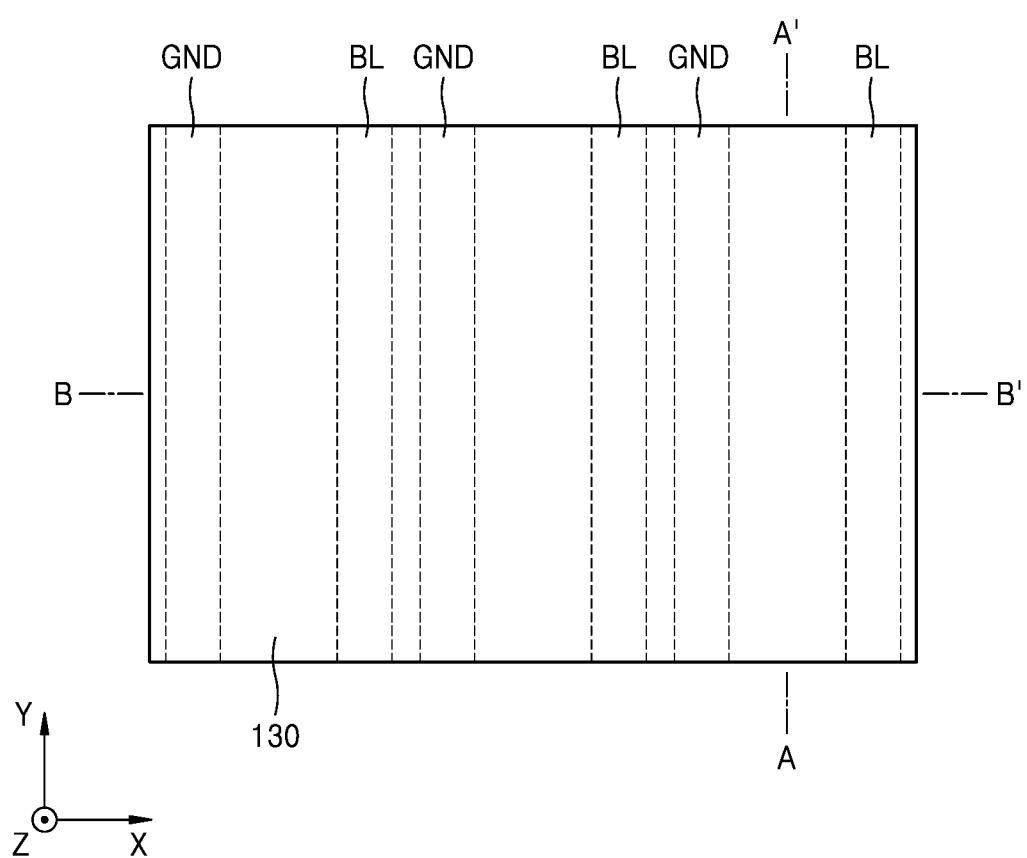
Figure 7B:
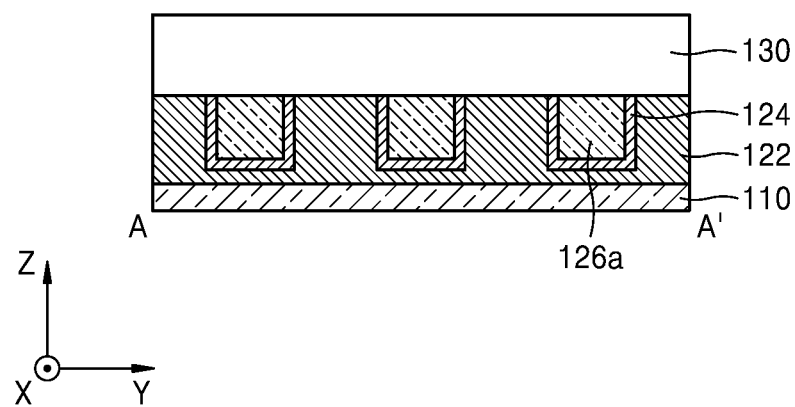
Figure 7C:
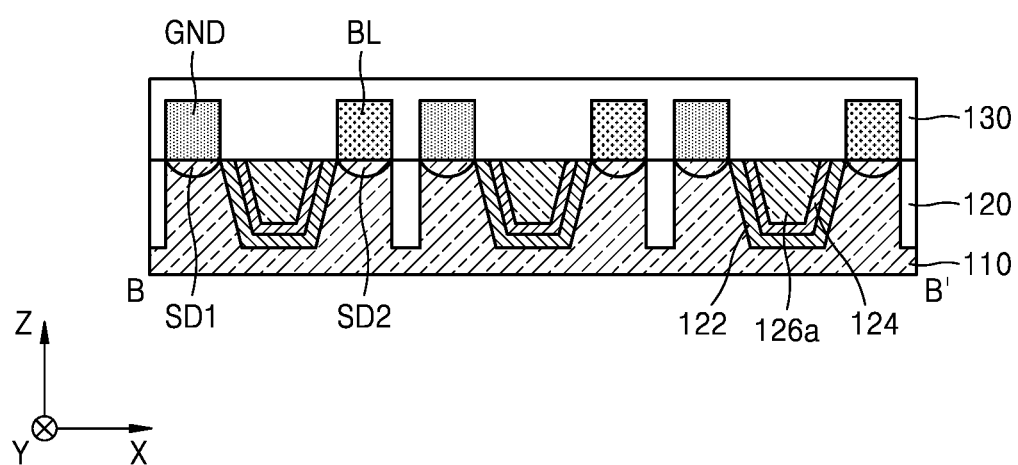

Referring to FIGS. 7A to 7C, the first source/drain SD1 and the second source/drain SD2 may be formed in the substrate 110. Next, the ground line GND on the first source/drain SD1 and the bit line BL on the second source/drain SD2 may be formed. Next, the first interlayer insulating layer 130 may be formed on the first gate dielectric layer 122, the ferroelectric layer 124, the bottom portion 126a of the gate layer 126, the ground line GND, and the bit line BL.

Figure 8A:
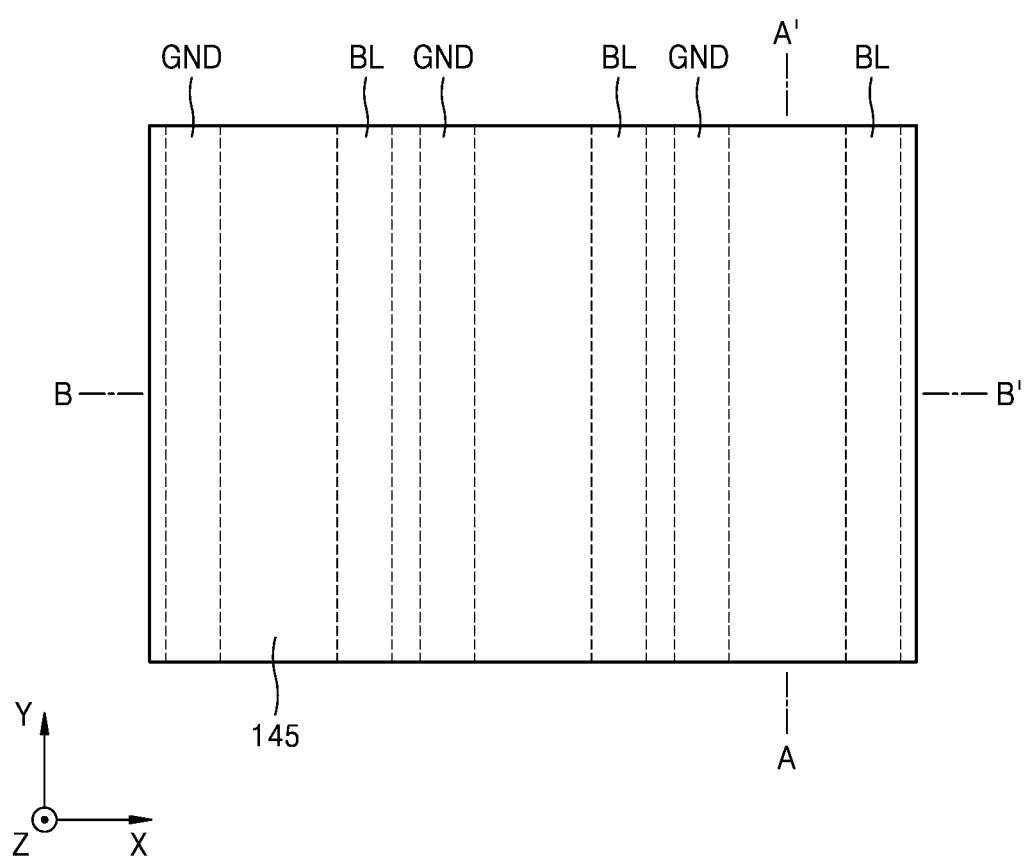
Figure 8B:
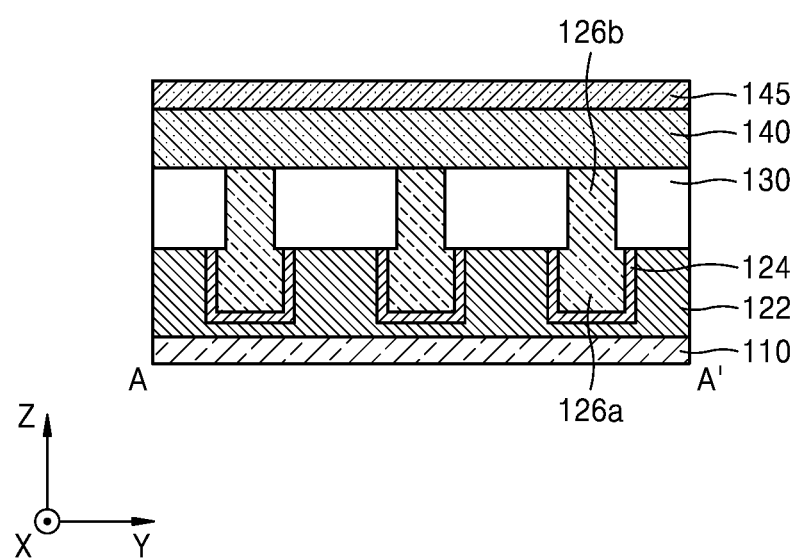
Figure 8C:
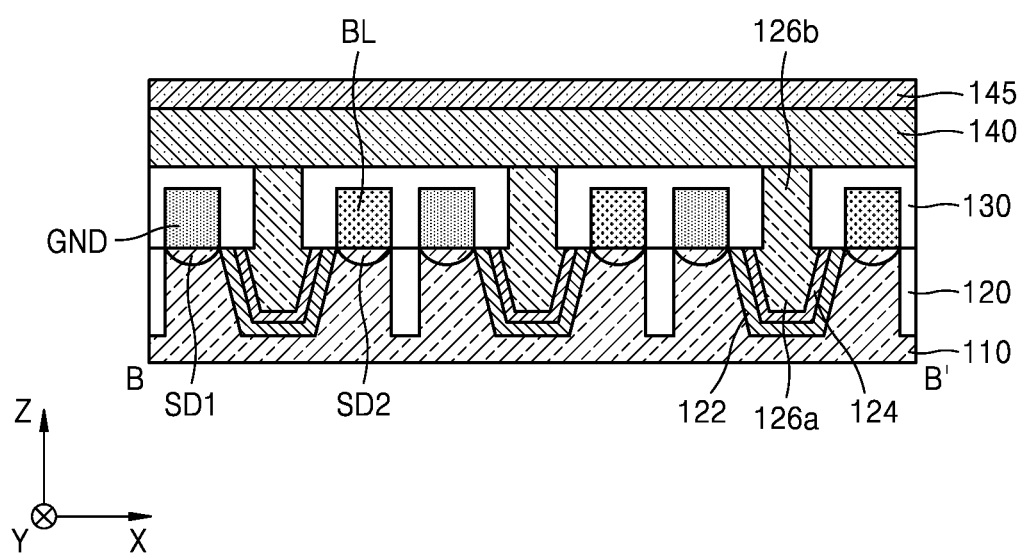

Referring to FIGS. 8A to 8C, the top portion 126b of the gate layer, which penetrates through the first interlayer insulating layer 130 and contacts the bottom portion 126a of the gate layer, may be formed. Next, the second interlayer insulating layer 140 may be formed on the top portion 126b of the gate layer and the first interlayer insulating layer 130. Next, a stop layer 145 may be formed on the second interlayer insulating layer 140. The stop layer 145 may include a material different from materials of the first interlayer insulating layer 130 and the second interlayer insulating layer 140. For example, when the first interlayer insulating layer 130 and the second interlayer insulating layer 140 include silicon oxide, the stop layer 145 may include silicon nitride.

Figure 9A:
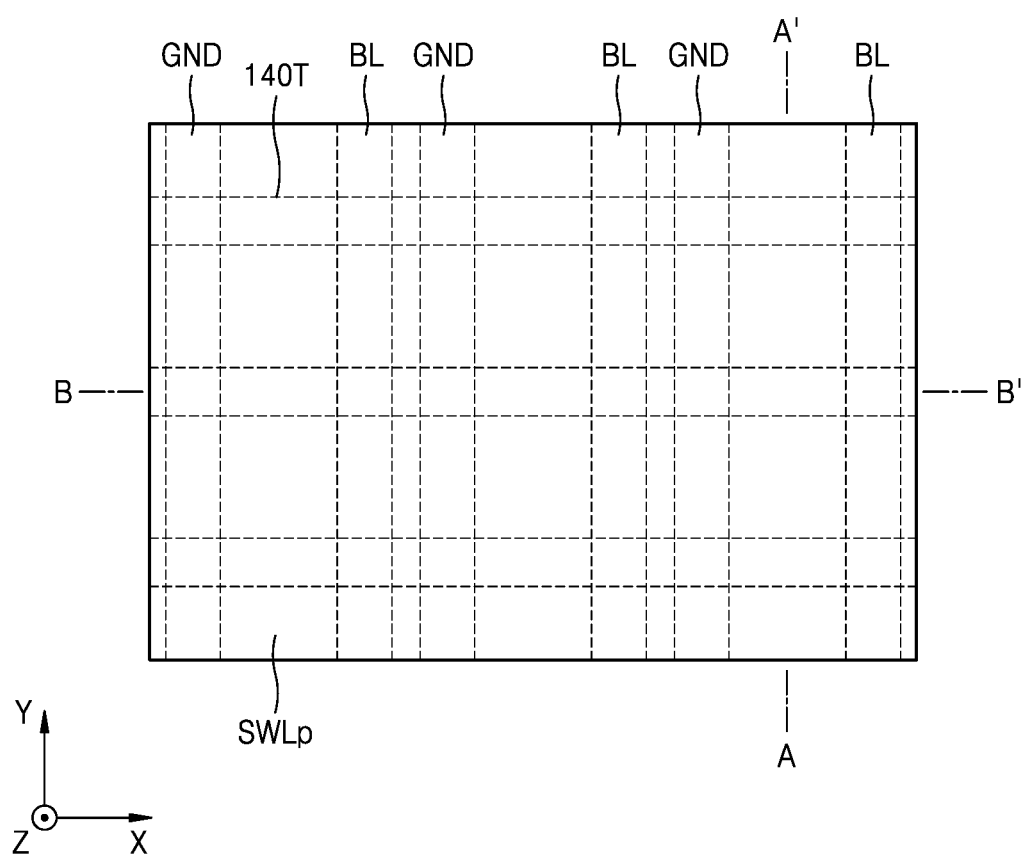
Figure 9B:
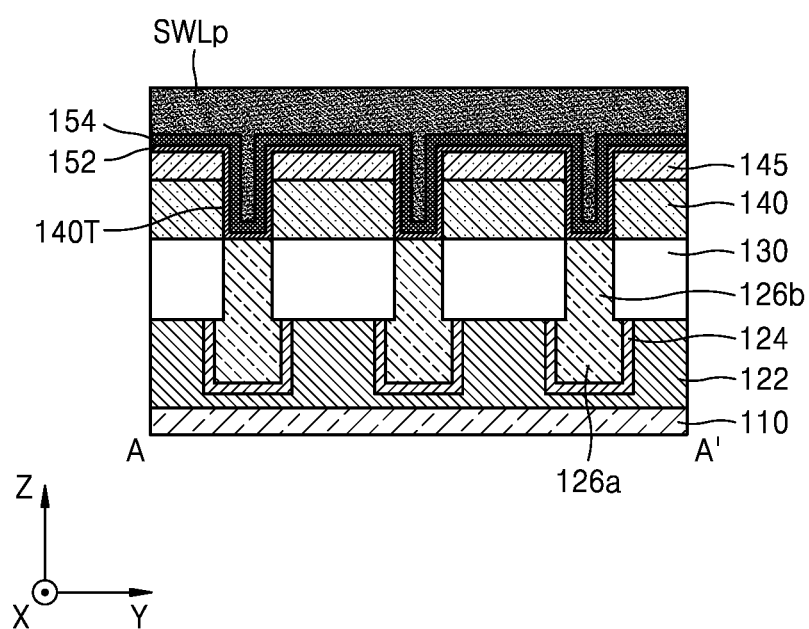
Figure 9C:
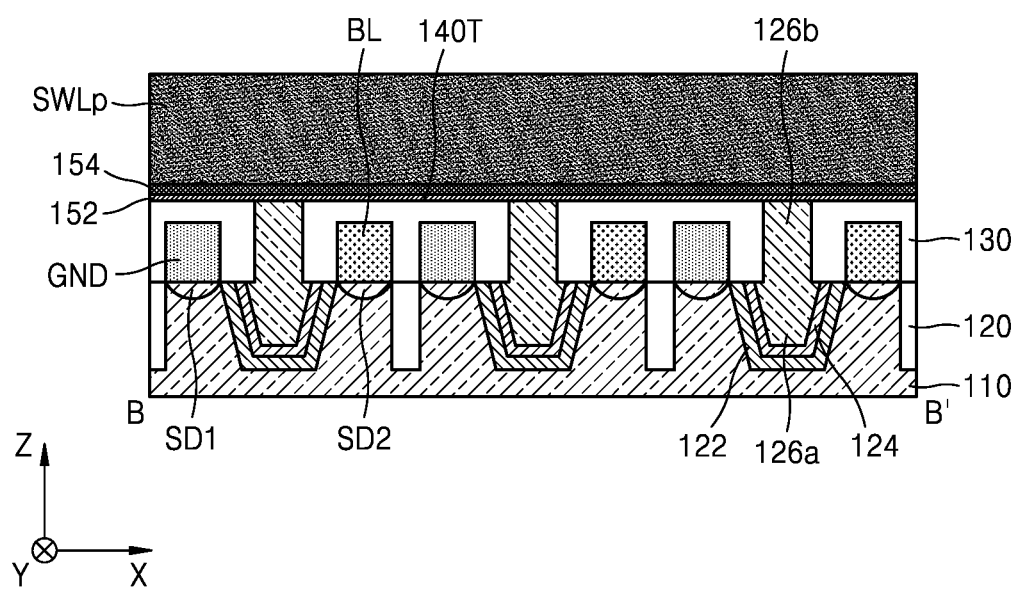
Figure 10A:
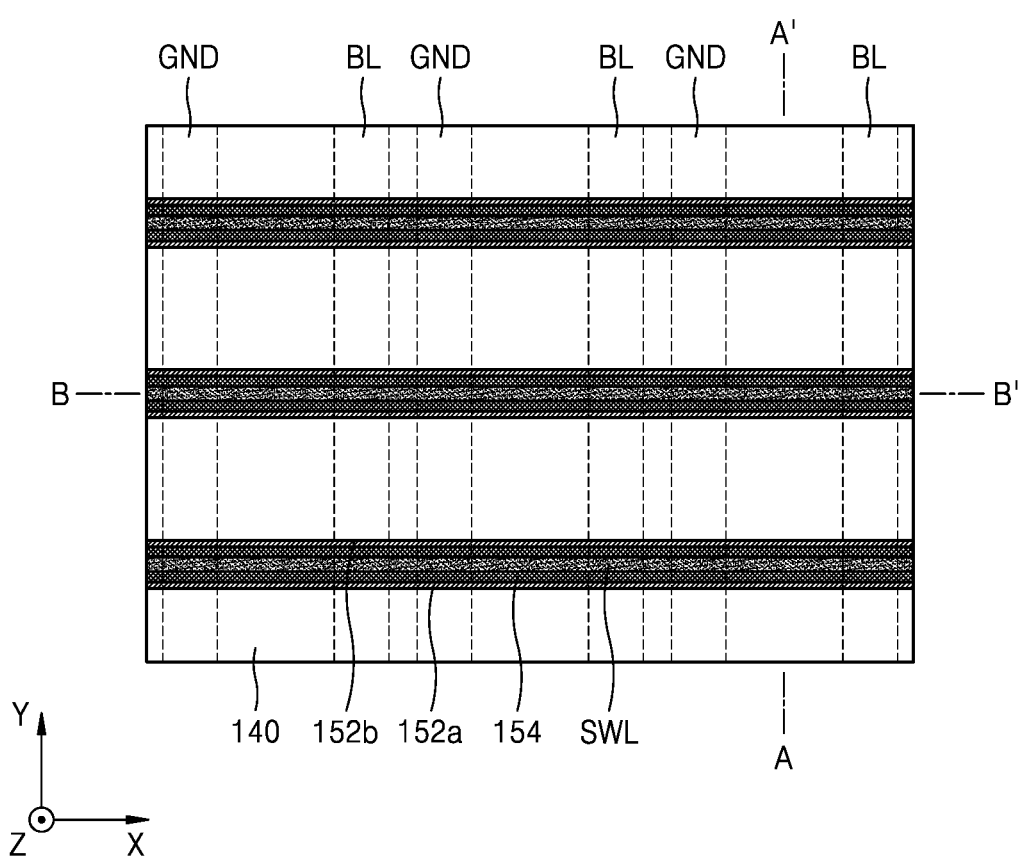
Figure 10B:
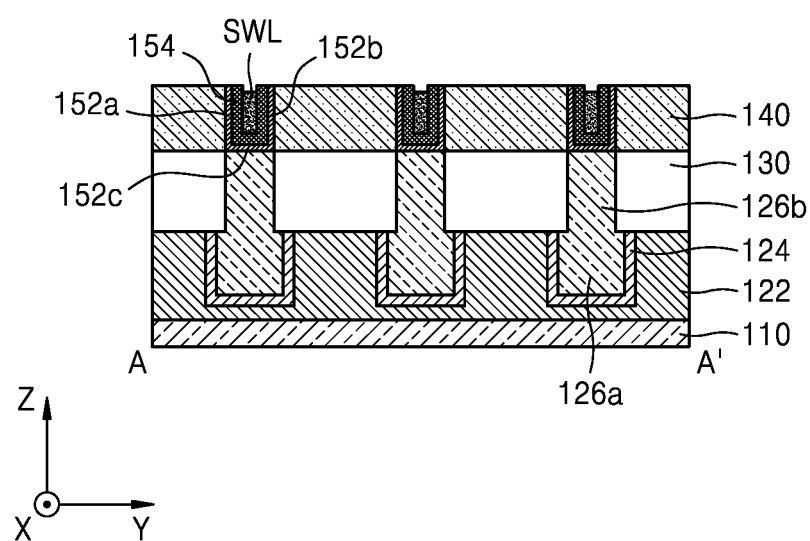
Figure 10C:
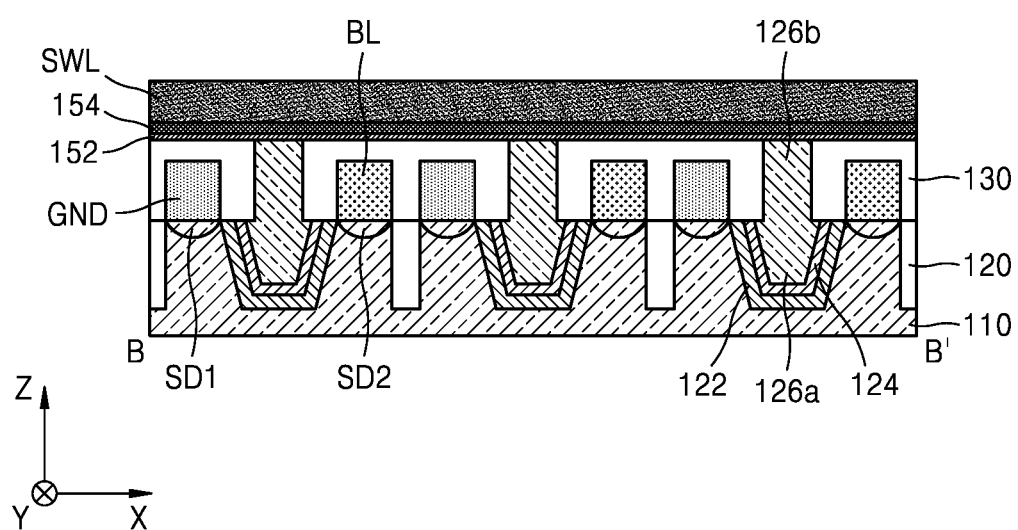

Referring to FIGS. 9A to 9C, a second line trench 140T extending in the first horizontal direction (the X direction) may be formed in the stop layer 145 and the second interlayer insulating layer 140. The channel layer 152 may be formed on a bottom surface and two side walls of the second line trench 140T and a top surface of the stop layer 145. Next, the second gate dielectric layer 154 may be formed on the channel layer 152. Next, a selection word line layer SWLp may be formed on the second gate dielectric layer 154.

Referring to FIGS. 9A to 9C and FIGS. 10A to 10C, the stop layer 145, the channel layer 152, the second gate dielectric layer 154, and the selection word line layer SWLp may be ground such that the second interlayer insulating layer 140 is exposed. The first channel 152a, the second channel 152b, and the channel connection layer 152c may be formed from the channel layer 152. The selection word line SWL may be formed from the selection word line layer SWLp. As a top portion of the selection word line SWL is selectively etched, a level of the top of the selection word line SWL may be lower than a level of the top of the second interlayer insulating layer 140 in the vertical direction (the Z direction). In some embodiments, a level of the top end of the selection word line SWL may be lower than a level of the top of the first channel 152a and a level of the top of the second channel 152b the vertical direction (the Z direction). In some embodiments, the level of the top of the selection word line SWL may be lower than a level of the top of the second gate dielectric layer 154 the vertical direction (the Z direction).

Figure 11A:
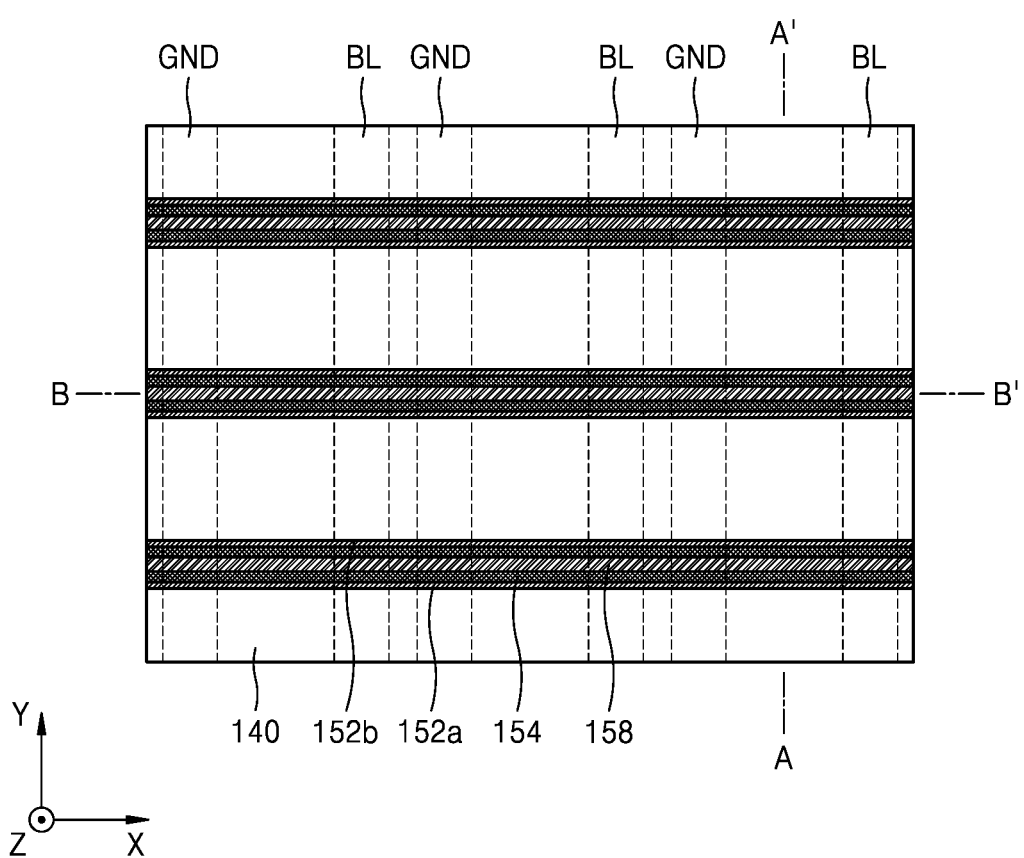
Figure 11B:
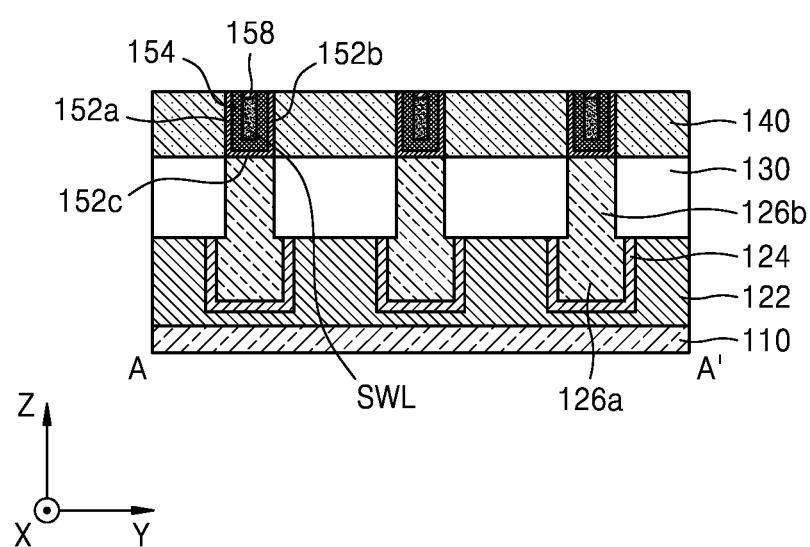
Figure 11C:
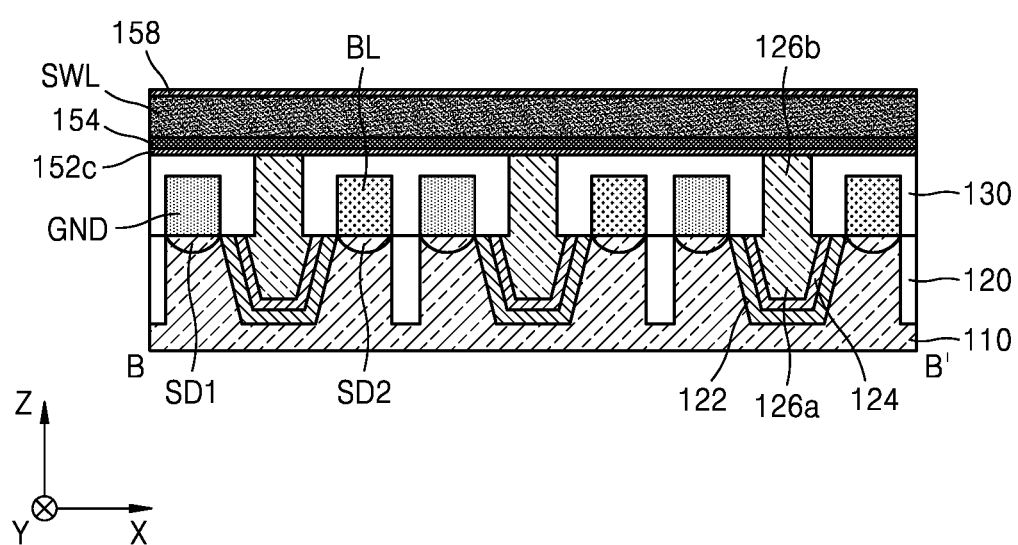

Referring to FIGS. 11A to 11C, the third gate dielectric layer 158 may be formed on the top of the selection word line SWL. For example, the third gate dielectric layer 158 may be formed on the selection word line SWL, the second gate dielectric layer 154, the first channel 152a, the second channel 152b, and the second interlayer insulating layer 140. Next, a top portion of the third gate dielectric layer 158 may be removed such that the second interlayer insulating layer 140 is exposed. By doing so, the third gate dielectric layer 158 may be formed in a space surrounded by the second gate dielectric layer 154 and the selection word line SWL.

Referring to FIGS. 5A to 5C, the third interlayer insulating layer 160 may be formed on the third gate dielectric layer 158. Furthermore, the cell word line CWL penetrating through the third interlayer insulating layer 160 may be formed on the second interlayer insulating layer 140, the first channel 152a, the second channel 152b, the second gate dielectric layer 154, and the third gate dielectric layer 158. The memory device 100 shown in FIGS. 5A to 5C may be manufactured according to the manufacturing methods described with reference to FIGS. 5A, 6A, 7A, 8A, 9A, 10A, and 11A, FIGS. 5B, 6B, 7B, 8B, 9B, 10B, and 11B, and FIGS. 5C, 6C, 7C, 8C, 9C, 10C, and 11C.

While the inventive concept has been particularly shown and described with reference to embodiments thereof, it will be understood that various changes in form and details may be made therein without departing from the spirit and scope of the following claims.

What is claimed is:
1. A memory device comprising:
a substrate;
a ferroelectric field effect transistor disposed on the substrate;
a first channel contacting a gate structure of the ferroelectric field effect transistor and extending in a vertical direction from the gate structure of the ferroelectric field effect transistor;
a selection word line disposed at a side of the first channel;

a first gate dielectric layer disposed between the first channel and the selection word line; and a cell word line disposed on top of the first channel.

2. The memory device of claim 1, wherein the gate structure comprises a ferroelectric layer and a gate layer stacked on the substrate.

3. The memory device of claim 2, wherein the gate structure further comprises a second gate dielectric layer between the substrate and the ferroelectric layer.

4. The memory device of claim 1, wherein a bottom portion of the gate structure is recessed into the substrate.

5. The memory device of claim 1, wherein the ferroelectric field effect transistor comprises the gate structure disposed on the substrate, a first source/drain at one side of the gate structure, and a second source/drain at another side of the gate structure.

6. The memory device of claim 5, further comprising a ground line that is in contact with the first source/drain.

7. The memory device of claim 6, further comprising a bit line that is in contact with the second source/drain.

8. The memory device of claim 7, wherein the ground line and the bit line extend in parallel to each other.

9. The memory device of claim 7, wherein the ground line and the bit line extend not parallel to the selection word line.

10. The memory device of claim 7, wherein the ground line and the bit line extend in parallel to the cell word line.

11. The memory device of claim 7, further comprising an interlayer insulating layer disposed between the ground line and the selection word line and between the bit line and the selection word line.

12. The memory device of claim 11, wherein the interlayer insulating layer further extends between the ground line and a top portion of the gate structure and between the bit line and the top portion of the gate structure.

13. The memory device of claim 1, wherein the first gate dielectric layer contacts two opposite surfaces and a bottom surface of the selection word line.

14. The memory device of claim 1, further comprising a second channel contacting the gate structure of the ferroelectric field effect transistor and extending in the vertical direction from the gate structure of the ferroelectric field effect transistor, and the selection word line passes between the first channel and the second channel.

15. The memory device of claim 14, wherein the first gate dielectric layer further extends between the second channel and the selection word line.

16. The memory device of claim 15, further comprising a channel connection layer disposed on and contacting the gate structure of the ferroelectric field effect transistor and connecting the first channel to the second channel.

17. The memory device of claim 16, wherein the first gate dielectric layer further extends between the channel connection layer and the selection word line.

18. The memory device of claim 1, further comprising a third gate dielectric layer disposed between the selection word line and the cell word line.

19. A memory device comprising:

a first memory cell, a second memory cell, a third memory cell, and a fourth memory cell each comprising a ferroelectric field effect transistor and a field effect transistor, wherein the ferroelectric field effect transistor comprises a grounded first source/drain, a first gate structure, and a second source/drain, and the field effect transistor comprises a third source/drain connected to the first gate structure, a second gate structure, and a fourth source/drain;

a first selection word line connected to the second gate structure of each of the first memory cell and the second memory cell;

a second selection word line connected to the second gate structure of each of the third memory cell and the fourth memory cell;

a first bit line connected to the second source/drain of each of the first memory cell and the third memory cell;

a second bit line connected to the second source/drain of each of the second memory cell and the fourth memory cell;

a first cell word line connected to the fourth source/drain of each of the first memory cell and the third memory cell; and a second cell word line connected to the fourth source/drain of each of the second memory cell and the fourth memory cell, wherein, in a write operation on the fourth memory cell, a switching voltage is applied to the second selection word line, a write voltage is applied to the second cell word line, and 0 V is applied to the first bit line, the first selection word line, the first cell word line, and the second bit line.

20. A memory device comprising:

a substrate;

a gate structure comprising a first gate dielectric layer, a ferroelectric layer, and a gate layer stacked on the substrate;

a first source/drain disposed at one side of the gate structure;

a second source/drain disposed at another side of the gate structure;

a ground line in contact with the first source/drain and extending in a first horizontal direction;

a bit line in contact with the second source/drain and extending in the first horizontal direction;

a first channel and a second channel each contacting the gate structure, and each extending in a vertical direction from the gate structure;

a channel connection layer disposed on the gate layer, the channel connection layer connecting the first channel to the second channel, and contacting the gate structure;

a selection word line disposed between the first channel and the second channel and extending in a second horizontal direction;

a second gate dielectric layer extending between the first channel and the selection word line, between the second channel and the selection word line, and between the channel connection layer and the selection word line;

a cell word line disposed on top of the first channel and top of the second channel; and a third gate dielectric layer disposed between the cell word line and the selection word line.

* * * * *